United States Patent [19]

Nojima et al.

[11] Patent Number: 5,491,410
[45] Date of Patent: Feb. 13, 1996

[54] SUPERCONDUCTING MAGNETIC SENSOR HAVING A FERROMAGNETIC ELEMENT FOR CONVERGING AN EXTERNAL MAGNETIC FIELD

[75] Inventors: Hideo Nojima, Nara; Hidetaka Shintaku, Fujisawa; Masaya Nagata, Souraku; Manabu Fujimoto, Tenri; Masayoshi Koba, Nara, all of Japan

[73] Assignee: Sharp Kabushiki Kaisha, Osaka, Japan

[21] Appl. No.: 993,241

[22] Filed: Dec. 17, 1992

[30] Foreign Application Priority Data

Dec. 20, 1991 [JP] Japan .................................. 3-338430

[51] Int. Cl.$^6$ .......................... G01R 33/035; G01R 33/06
[52] U.S. Cl. ........................ 324/248; 324/252; 505/845
[58] Field of Search .................................. 324/248, 252; 338/32 R, 32 S; 307/306; 327/527; 505/845

[56] References Cited

U.S. PATENT DOCUMENTS

| | | | |
|---|---|---|---|
| 4,996,621 | 2/1991 | Ruigrok et al. | 324/248 |
| 5,011,818 | 4/1991 | Katoka et al. | 324/248 |
| 5,119,025 | 6/1992 | Smith et al. | 324/252 |

FOREIGN PATENT DOCUMENTS 0381541 8/1990 European Pat. Off. .

OTHER PUBLICATIONS

"Magnetoresistive Effect of Ceramic High Tc Superconductor Film and its Application to Magnetic Sensors" by Hideo Nojima et al., Sharp Techical Bulletin No. 45 (Jun., 1990), pp. 17–22.

"Galvanomagnetic Effect of an Y–Ba–Du–O Ceramic Superconductor and Its Application to Magnetic Sensors" by Hideo Nojima et al., Japanese Journal of Applied Physics, vol. 27, No. 5, May, 1988, pp. 746–750.

Primary Examiner—Walter E. Snow

[57] ABSTRACT

A superconductive magnetoresistor has a substrate, a ceramic superconductive film which is formed on one face of the substrate, ferromagnetic elements for focusing an external magnetic field, and an insulating film. One of the ferromagnetic elements is integrally combined with the other face of the substrate. The other of the ferromagnetic elements is combined with the ceramic superconductive film thorough the insulating film.

6 Claims, 11 Drawing Sheets

SUPERCONDUCTING MAGNETIC SENSOR HAVING A FERROMAGNETIC ELEMENT FOR CONVERGING AN EXTERNAL MAGNETIC FIELD

BACKGROUND OF THE INVENTION

1. Field of the Invention

The present invention relates to superconducting magnetic sensors and, more particularly, to a superconducting magnetic sensor utilizing magnetoresistance effect developing from a grain boundary in a superconductive ceramic material.

2. Description of the Prior Art

Hitherto, for the purpose of magnetic field detection, Hall elements utilizing the Hall effect of a semiconductor or magnetoresistors utilizing the magnetoresistance effect of a semiconductor or magnetic material have been widely used. Also, superconducting quantum interference devices (SQUID's) which utilize the quantum interference effect of a superconductor have been used as very high sensitive magnetic sensors. However, the magnetic sensitivity of such Hall elements, or such semiconductor or magnetic material magnetoresistors is of the order of $10^{-3}$ to $10^{-4}$ gauss. In order for them to be used in a wider range of applications, it is necessary that they must have a higher magnetic sensitivity. It is known that SQUID's have a higher degree of magnetic sensitivity, or a sensitivity level of $10^{-10}$ gauss, but the problem is that they require very strict configurational precision and a very complicated drive system, thus involving considerable difficulty in operational control. For these reasons, there has been much need for an improved magnetic sensor which has a high magnetic sensitivity and is easy to use.

In view of such situation, about four years ago the present inventors et al. proposed a high-performance magnetic sensor (superconducting magnetoresistor) utilizing magnetoresistance effect developing from a grain boundary in a superconductive ceramic material (U.S. Pat. No. 5,011,818). This superconducting magnetoresistor comprises a ceramic superconductive film of a specified pattern configuration placed on a substrate. It has various good characteristic features: (1) that it exhibits high magnetic sensitivity of $10^{-6}$ gauss level or a sensitivity level which is far much greater than that of any conventional magnetic sensor using a semiconductor or magnetic material (Sharp Technical Bulletin No. 45 (1990)); (2) that it is simple in construction and affords ease of handling; and (3) that it can detect analog and digital signals.

However, in order that a magnetic sensor may be employed in detecting biomagnetism, such as magnetocardiowave or pulmomagnetofield, or conducting non-destructive inspections of metal materials for corrosion or defect detection, or for resource exploration purposes, it is necessary that the sensor must have a magnetic sensitivity level of $10^{-7}$. As such, further one-figure improvement in sensitivity has been desired of the above mentioned prior-art superconducting magnetic sensor.

In order to achieve a magnetic sensitivity level of $10^{-7}$ gauss, the present inventor et al. recently proposed an arrangement wherein superconductive magnetoresistors are laminated on a substrate and electrically interconnected to provide a larger device length, so that improved magnetic sensitivity can be obtained without any decrease in space resolving capability. In this arrangement, however, the laminated superconductive magnetoresistors are electrically interconnected, and this requires a complicated process of fabrication.

SUMMARY OF THE INVENTION

The object of the present invention is therefore to provide a superconducting magnetic sensor which can be fabricated through a simple process and yet can exhibit an improved magnetic sensitivity performance on the order of more than $10^{-7}$ gauss.

In order to achieve the aforementioned object, there is provided a superconducting magnetic sensor comprising a substrate, a superconductive magnetoresistor formed on the substrate, the superconductive magnetoresistor being comprised of a ceramic superconductive film, and a ferromagnetic element for converging an external magnetic field into the superconductive magnetoresistor.

It is preferable that said ferromagnetic element is integrally combined with the superconductive magnetoresistor through an insulating film.

Further, it is preferable that said ferromagnetic element is in the form of a film and is mounted in position with a face of the ferromagnetic element opposed to said superconductive magnetoresistor.

Furthermore, it is preferable that said ferromagnetic element is in the form of a film and is laminated on said superconductive magnetoresistor.

It is preferable that a spacer is disposed between said superconductive magnetoresistor and said ferromagnetic element for separating said superconductive magnetoresistor and said ferromagnetic element from each other.

Moreover, it is preferable that said ferromagnetic element is truncated cone-shaped.

In the superconducting magnetic sensor according to the invention, the ferromagnetic element converges an external magnetic field and the converged magnetic field is conducted into the superconductive magnetoresistor. Therefore, good improvement can be effectively obtained in magnetic sensitivity over the level obtainable in the case where no ferromagnetic element is provided. Thus, a sensitivity level of $10^{-7}$ gauss can be achieved. Furthermore, the superconducting magnetic sensor of the invention comprises a combination of a superconductive magnetoresistor and a ferromagnetic element and does not involve any complicated wire connection. Therefore, this sensor can be fabricated through a much simplified process as compared with the superconducting magnetic sensor which was previously proposed by the present inventor et al.

When the ferromagnetic element is integrally combined with the superconductive magnetoresistor through an insulating film, the insulating film can prevent the superconducutive magnetoresistor from short-circuiting due to contact with the ferromagnetic element, and yet the superconducting magnetic sensor can be easily fabricated.

When the ferromagnetic element is in film form and is disposed with its film surface opposed to the superconductive magnetoresistor, the ferromagnetic element can efficiently converge an external magnetic field even if it is of a relatively small size. This provides for compact construction of the superconducting magnetic sensor.

Also, when the ferromagnetic element is in film form and is laminated on the superconductive magnetoresistor, the ferromagnetic element can efficiently converge an external magnetic field even if it is of a relatively small size. This provides for compact construction of the superconducting magnetic sensor.

Where a spacer which separates the superconductive magnetoresistor and the ferromagnetic element from each other is provided between the superconductive magnetoresistor and the ferromagnetic element, the constituents of the ferromagnetic element can be prevented from reacting with the superconductive magnetoresistor in the process of sensor fabrication. This, in turn, prevents possible degradation of the superconductive characteristics of the sensor during the process of fabrication thereof. After completion of the sensor as such, the superconductive magnetoresistor is prevented from short-circuiting due to contact with the ferromagnetic element.

When the ferromagnetic element is truncated cone-shaped, the ferromagnetic element can efficiently converge an external magnetic field.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (First Embodiment)

The superconducting magnetic sensor of the invention will now be described in further detail by way of embodiments.

Figure 1:
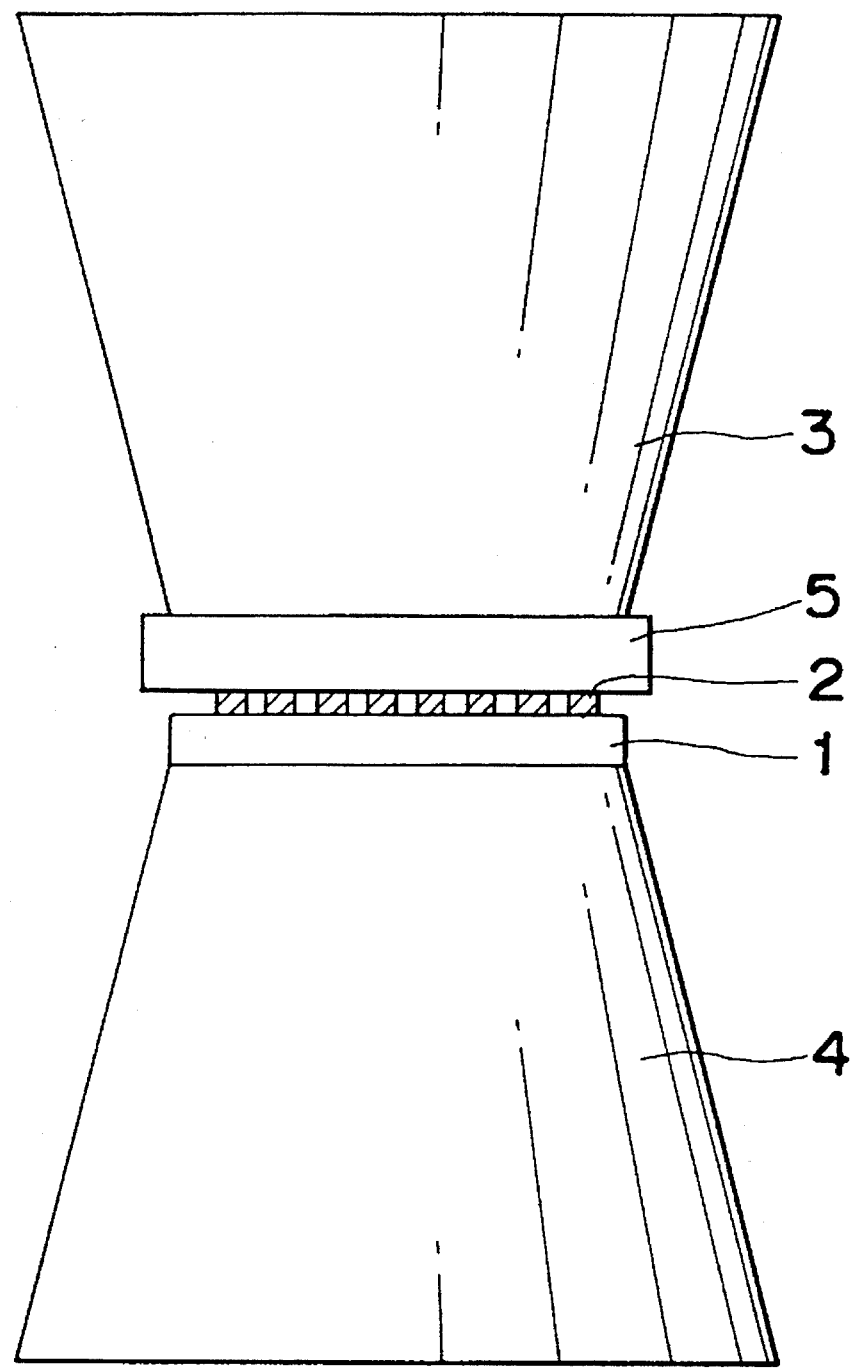
FIG. 1 is an elevational view partly in section showing the construction of a superconducting magnetic sensor representing a first embodiment of the present invention.

FIG. 1 shows the configuration of a superconducting magnetic sensor representing a first embodiment of the invention. The superconducting magnetic sensor shown has a superconducting magnetoresistor 2 formed on one side of a substrate (of 0.5 mm in thickness) 1. A ferromagnetic element 3 is mounted on the superconductive magnetoresistor 2 through an insulating film (of 100 μ in thickness) 5 which serves as a spacer, and on the opposite surface of the substrate 1 is directly mounted a ferromagnetic element 4. The insulating film 5 prevents the superconductive magnetoresistor from short-circuiting due to contact with the ferromagnetic element 3.

The superconductive magnetoresistor 2 is comprised of an Ag-added $Y_1Ba_2Cu_3O_{7-x}$ ceramic superconductive film which is patterned in a meandrous fashion.

The superconductive magnetoresistor 2 is fabricated by employing the electric deposition technique in the following manner. A substrate 1 made of yttrium stabilized zirconia (Y S Z) is prepared, and on the surface of the substrate 1 is formed a copper thin film (of about 200 in thickness) by vacuum deposition. The copper thin film thus formed is patterned by chemical etching into an electrode of meandrous shape (of 500 μm in line width and 250 mm in line length) and a counter electrode which is opposed to the electrode in parallel therewith within the surface of the substrate 1. The spacing between the meander electrode and the counter electrode is 100 μm. An electrodeposition solution is prepared by dispersing into acetone a mixture of $Y_1Ba_2Cu_3O_{7-x}$ powder (of 1–10 μm in particle diameter) and $Ag_2O$ powder (of 5–10 μm in particle diameter) which is prepared by coprecipitation. For this purpose, the weight ratio of $Ag_2O$ powder to $Y_1Ba_2Cu_3O_{7-x}$ powder is 2%. Nextly, the substrate 1 provided with the meander electrode is immersed in the electrodeposition solution. A 100 V voltage is applied across the electrodes for about one minute, with the meander electrode at negative potential and the counter electrode at positive potential. Films are selectively deposited only on the meander electrode at negative potential. Subsequently, heat treatment is carried out in air at 900° C. for three hours to sinter the deposited films. Thus, an Ag-added $Y_1Ba_2Cu_3O_{7-x}$ superconducting ceramic film having a thickness of 50 μm is formed. That is, there is formed a superconductive magnetoresistor 2 of meander shape having a line width of 500 μm, a line length of 250 mm, and a thickness of 50 μm. Measurement was made of the electric resistance of a superconductive magnetoresistor 2 comprised of the Ag-added $Y_1Ba_2Cu_3O_{7-x}$ superconducting ceramic film thus formed. The measurement showed zero resistance at the temperature of 86K.

The ferromagnetic elements 3, 4 are comprised of a permalloy (Fe-Ni (78%)) having a permeability of about 25,000 or more. Each of the ferromagnetic elements 3, 4 is truncated cone-shaped and has bottom diameters of 25 mm and 15 mm and a height of 20 mm.

Figure 2:
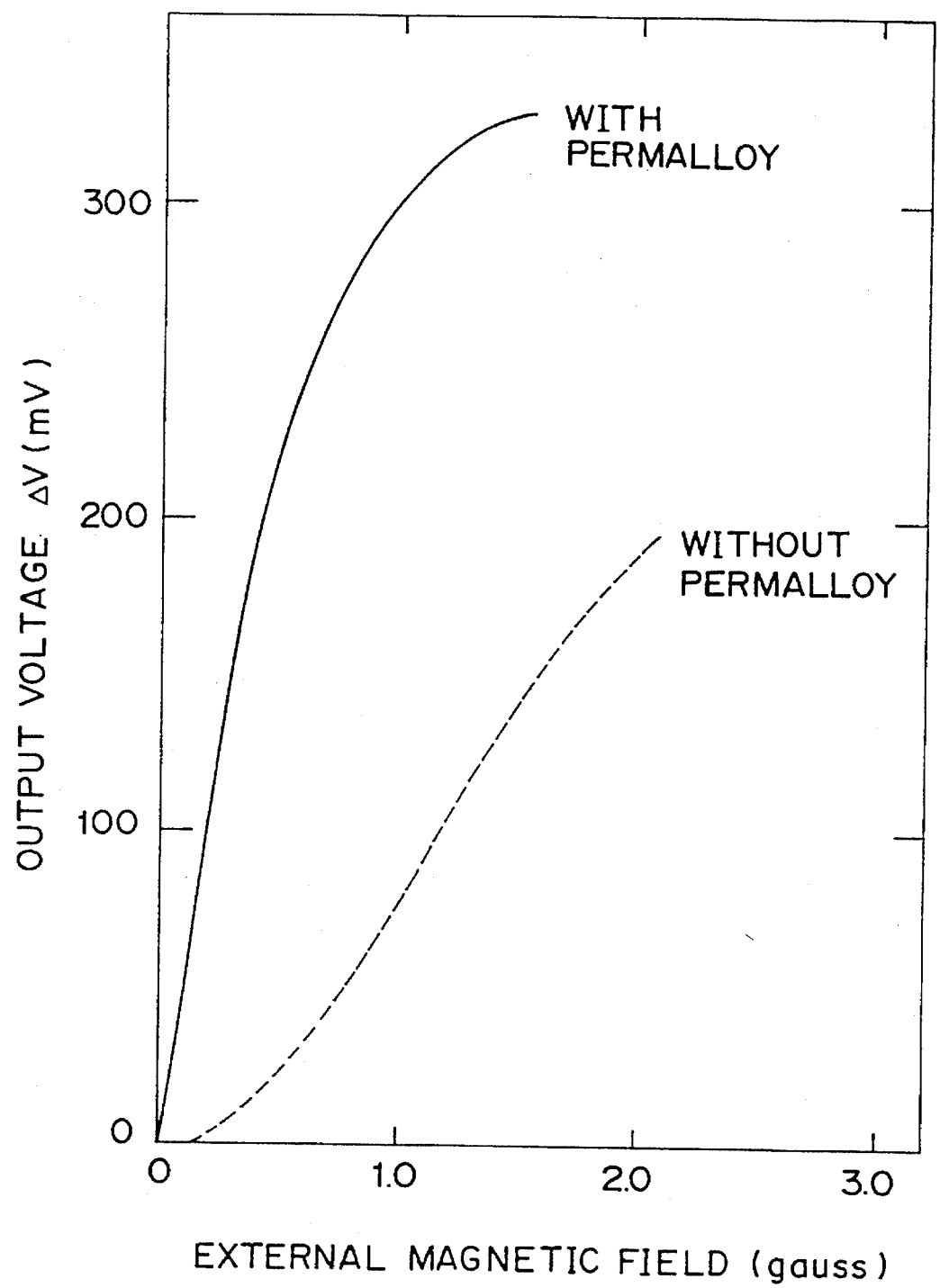
FIG. 2 is a graph showing galvanomagnetic characteristics of the superconducting magnetic sensor of the first embodiment.

FIG. 2 shows, by solid line, the galvanomagnetic characteristics of a superconducting magnetic sensor of the above described construction (provided with permalloy elements) at a liquid nitrogen temperature of 77K (in which figure the broken line shows the characteristics of a single element unit (not combined with a ferromagnetic element); same applies in FIGS. 5, 6, 10, 11, 12, and 15). As shown in FIG. 2, the provision of permalloy elements 3, 4 results in good improvement in galvanomagnetic sensitivity, and more particularly in the sensitivity in low magnetic field, say, to the tune of more than ten times as high as that of the single element unit. Further, the sensor of the above construction exhibited a magnetic sensitivity of $5 \times 10^{-8}$ gauss/(Hz)$^{1/2}$ as against $6 \times 10^{-7}$ gauss/(Hz)$^{1/2}$ with single element.

In this way, by the superconductive magnetoresistor 2 being integrally combined with the ferromagnetic elements 3, 4 thereby to converge an external magnetic field, a magnetic sensitivity of more than $10^{-7}$ gauss level could be achieved. Furthermore, the sensor could be easily fabricated without involving complicated connections.

(Second Embodiment)

Figure 3:
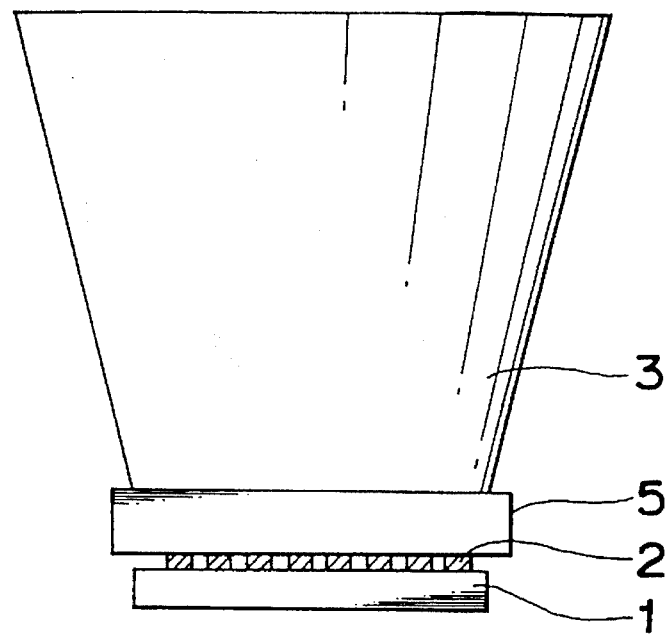
FIG. 3 is an elevational view partly in section showing the construction of a superconducting magnetic sensor representing a second embodiment of the present invention.
Figure 5:
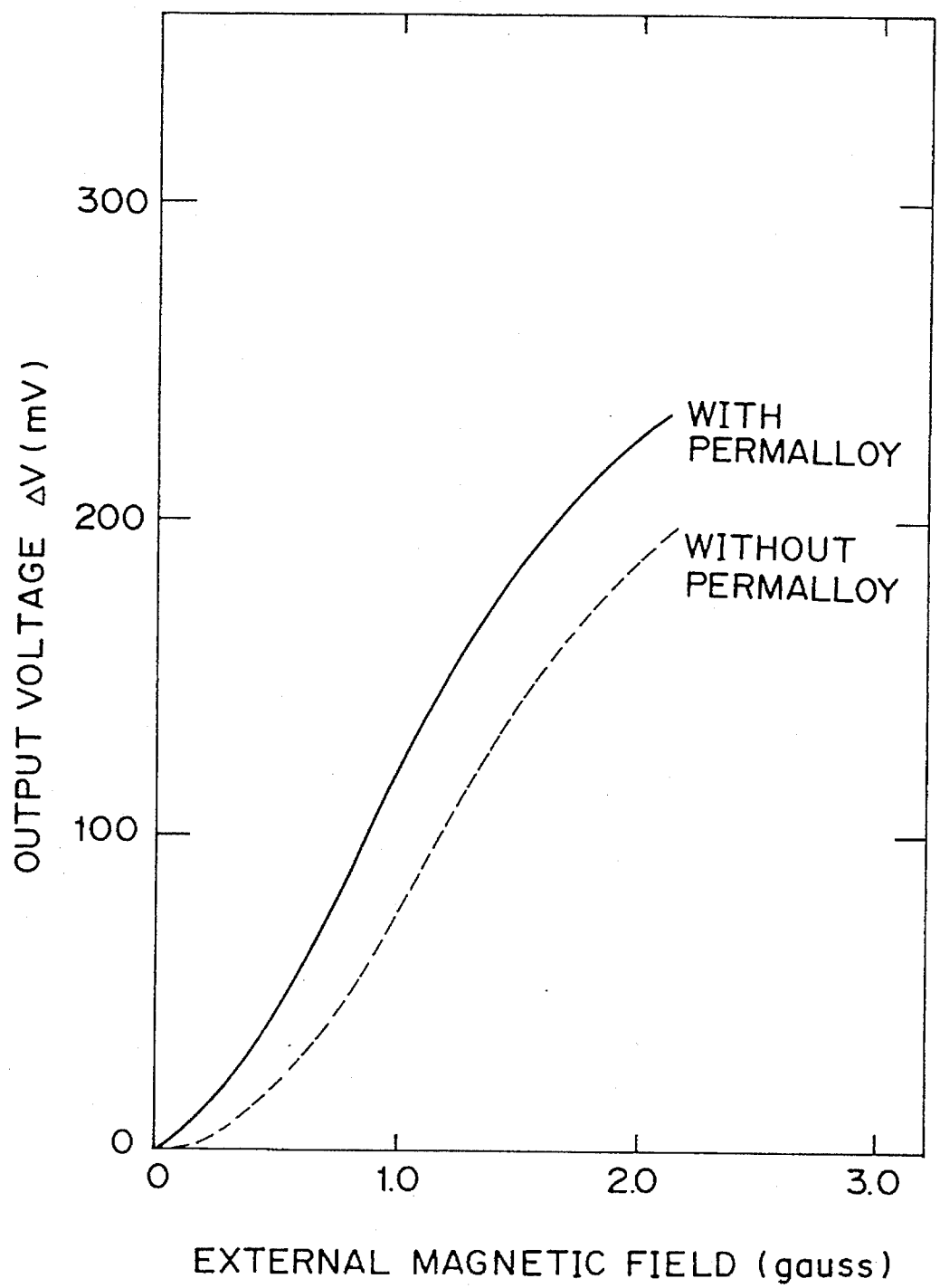
FIG. 5 is a graph showing galvanomagnetic characteristics of the superconducting magnetic sensor of the second embodiment.

FIG. 3 shows the configuration of a superconducting magnetic sensor of a second embodiment. This superconducting magnetic sensor has a ferromagnetic element (permalloy) 3 on one side only of the superconductive magnetoresistor 2 and not on both sides thereof. Other components of the sensor are identical with those of the first embodiment. As FIG. 5 shows, the galvanomagnetic sensitivity of the superconducting magnetic sensor at a liquid nitrogen temperature of 77K is greater than that of a single element unit (through the degree of improvement is smaller than that of the first embodiment). Measurement showed that the magnetic sensitivity of the sensor was $8 \times 10^{-8}$ gauss/(Hz)$^{1/2}$ at a frequency of 100 Hz).

(Third Embodiment)

Figure 4:
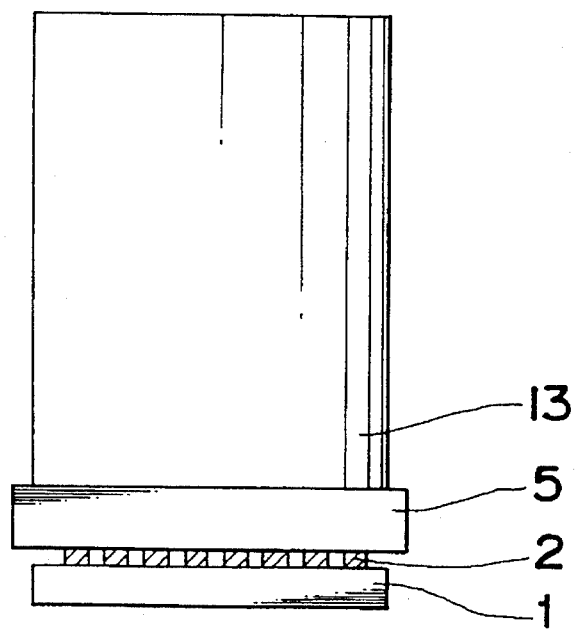
FIG. 4 is an elevational view partly in section showing the construction of a superconducting magnetic sensor representing a third embodiment of the present invention.
Figure 6:
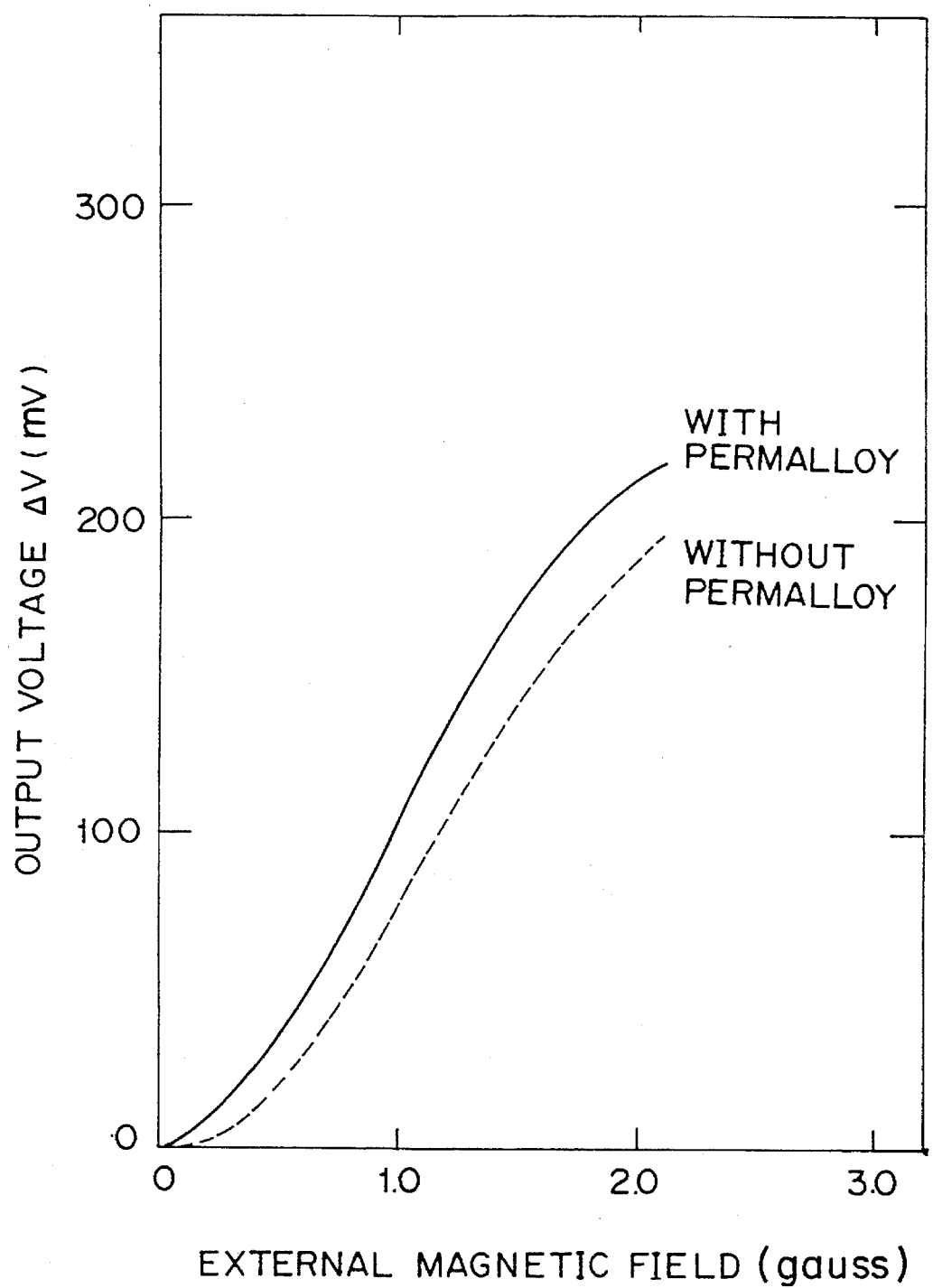
FIG. 6 is a graph showing galvanomagnetic characteristics of the superconducting magnetic sensor of the third embodiment.

FIG. 4 shows the configuration of a superconducting magnetic sensor representing a third embodiment. This superconducting magnetic sensor comprises a column-shaped permalloy element 13 instead of the truncated cone-shaped permalloy element 3 in the second embodiment. Other components are identical with those of the second embodiment. As FIG. 6 shows, the galvanomagnetic sensitivity of the superconducting magnetic sensor is greater than that of a single element unit (through the degree of improvement is smaller than those of the first and second embodiments). Measurement showed that the magnetic sensitivity of the sensor was $9 \times 10^{-8}$ gauss/(Hz)$^{1/2}$ at a frequency of 100 Hz).

(Fourth Embodiment)

Figure 7:
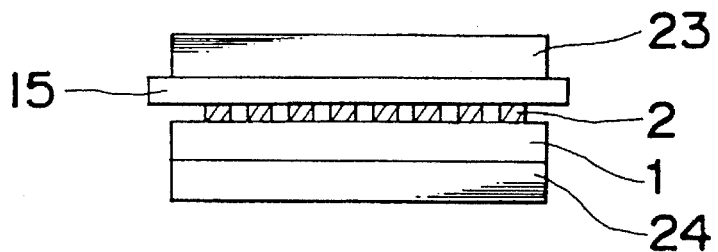
FIG. 7 is an elevational view partly in section showing the construction of a superconducting magnetic sensor representing a fourth embodiment of the present invention.
Figure 10:
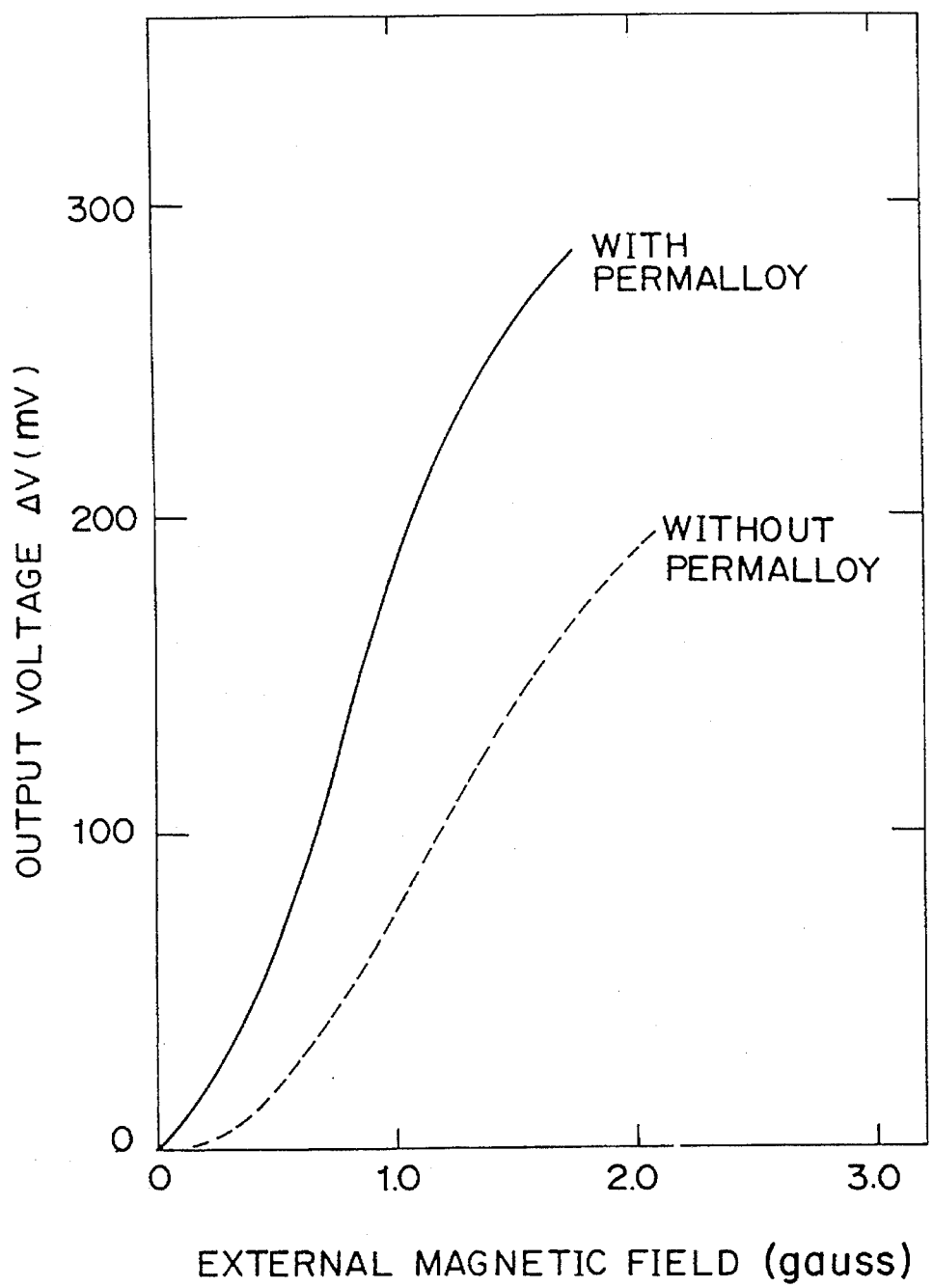
FIG. 10 is a graph showing galvanomagnetic characteristics of the superconducting magnetic sensor of the fourth embodiment.

FIG. 7 shows the configuration of a superconducting magnetic sensor of a fourth embodiment. This superconducting magnetic sensor comprises plate-shaped permalloy elements 23, 24 instead of the truncated cone-shaped permalloy elements 3, 4 of the first embodiment. More specifically, the permalloy element 23 is mounted on the superconductive magnetoresistor 2 through an insulating film 15 which serves as a spacer, and the permalloy element 24 is mounted directly on the opposite side of the substrate 1. As FIG. 10 shows, the galvanomagnetic sensitivity of the superconducting magnetic sensor is greater than that of a single element unit. Measurement showed that the magnetic sensitivity of the sensor was $7 \times 10^{-8}$ gauss/(Hz)$^{1/2}$.

(Fifth Embodiment)

Figure 8:
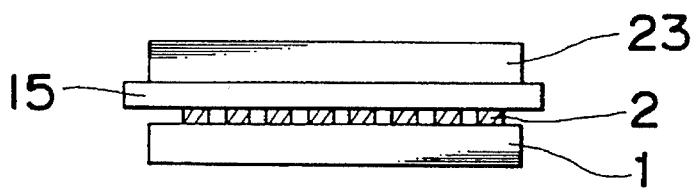
FIG. 8 is an elevational view partly in section showing the construction of a superconducting magnetic sensor representing a fifth embodiment of the present invention.
Figure 11:
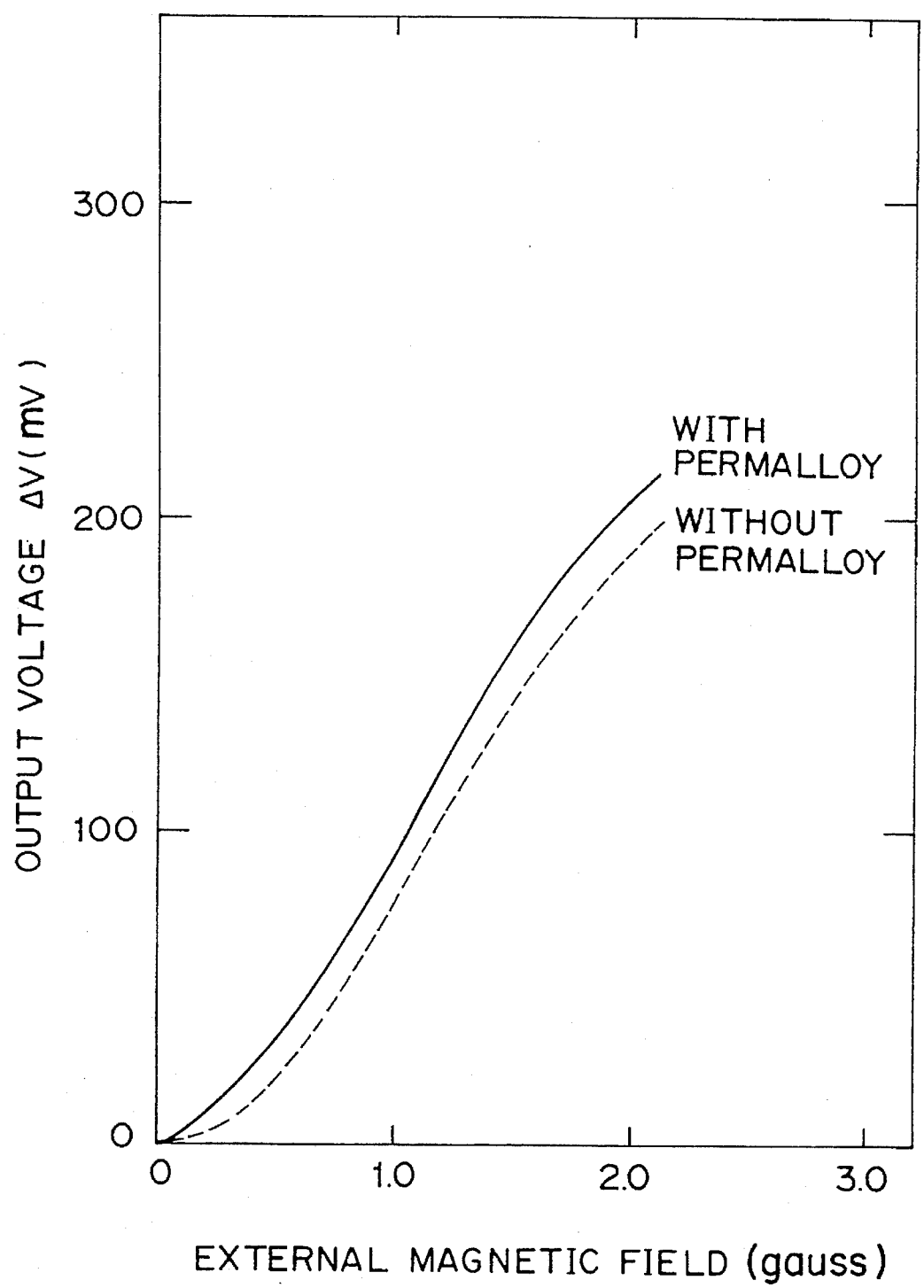
FIG. 11 is a graph showing galvanomagnetic characteristics of the superconducting magnetic sensor of the fifth embodiment.

FIG. 8 shows the configuration of a superconducting magnetic sensor of a fifth embodiment. This superconducting magnetic sensor has a plate-shaped permalloy element 23 provided on one side only of the superconductive magnetoresistor 2 and not on both sides thereof. Other components are identical with those of the fourth embodiment. As FIG. 11 shows, the galvanomagnetic sensitivity of the superconducting magnetic sensor is greater than that of a single element unit. Measurement showed that the magnetic sensitivity of the sensor was $1 \times 10^{-7}$ gauss/(Hz)$^{1/2}$.

(Sixth Embodiment)

Figure 9:
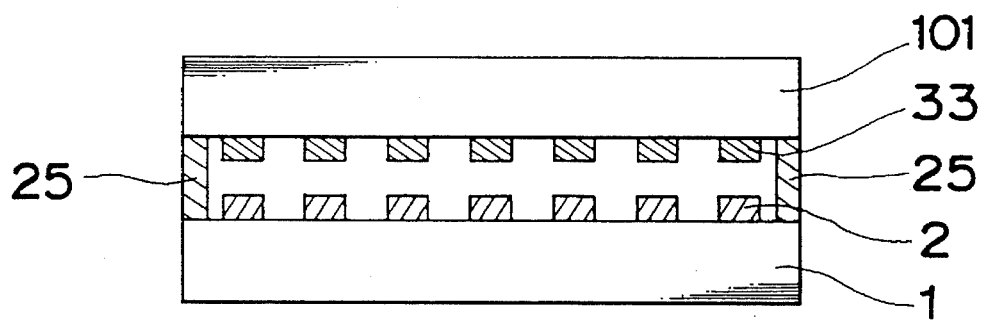
FIG. 9 is an elevational view partly in section showing the construction of a superconducting magnetic sensor representing a sixth embodiment of the present invention.

FIG. 9 shows the configuration of a superconducting magnetic sensor of a sixth embodiment. This superconducting magnetic sensor has a superconductive magnetoresistor (identical with the one earlier described) 2 formed on one side of a substrate 1, and a film-shaped ferromagnetic element 33 formed on a substrate 101, which are in opposed relation. The gap between the superconductive magnetoresistor 2 and the ferromagnetic element 33 is kept to a microfine clearance level (on the order of 50 μm) by means of spacer members 25. Therefore, this superconducting magnetic sensor is of a comparatively compact construction.

As in the case with the superconductive magnetoresistor 2, the ferromagnetic element 33 is formed by electrophoretic deposition in the following manner. A copper thin film (of about 2000 in thickness) is formed by vacuum metallization on one side of a substrate 101 of yttrium stabilized zirconia (Y S Z). The copper thin film thus formed is patterned by chemical etching into a meander-shaped electrode (with a line width of 500 μm and a line length of 250 mm) and a counter electrode opposed to the electrode in parallel therewith within the plane of the substrate. The spacing between the meander electrode and the counter electrode is 100 μm. Zinc ferrite (ZnFe$_2$O$_2$) is prepared as material for ferromagnetic element 33. Powder of this material is dispersed in acetone to prepare an electrodeposition solution. The substrate 101 provided with meander electrode is immersed in the electrodeposition solution. A voltage of 100 V is applied across the electrodes for one minute, with the meander electrode side at negative potential and the counter electrode side at positive potential. Zinc ferrite films are selectively deposited only on the meander electrode at negative potential. Subsequently, heat treatment is carried out in air at 900° C. for three hours to sinter the deposited films. Thus, a zinc ferrite film (with a line width of 500 μm and line length of 250 mm) 33 of meander shape having a thickness of 50 μm is formed.

Figure 12:
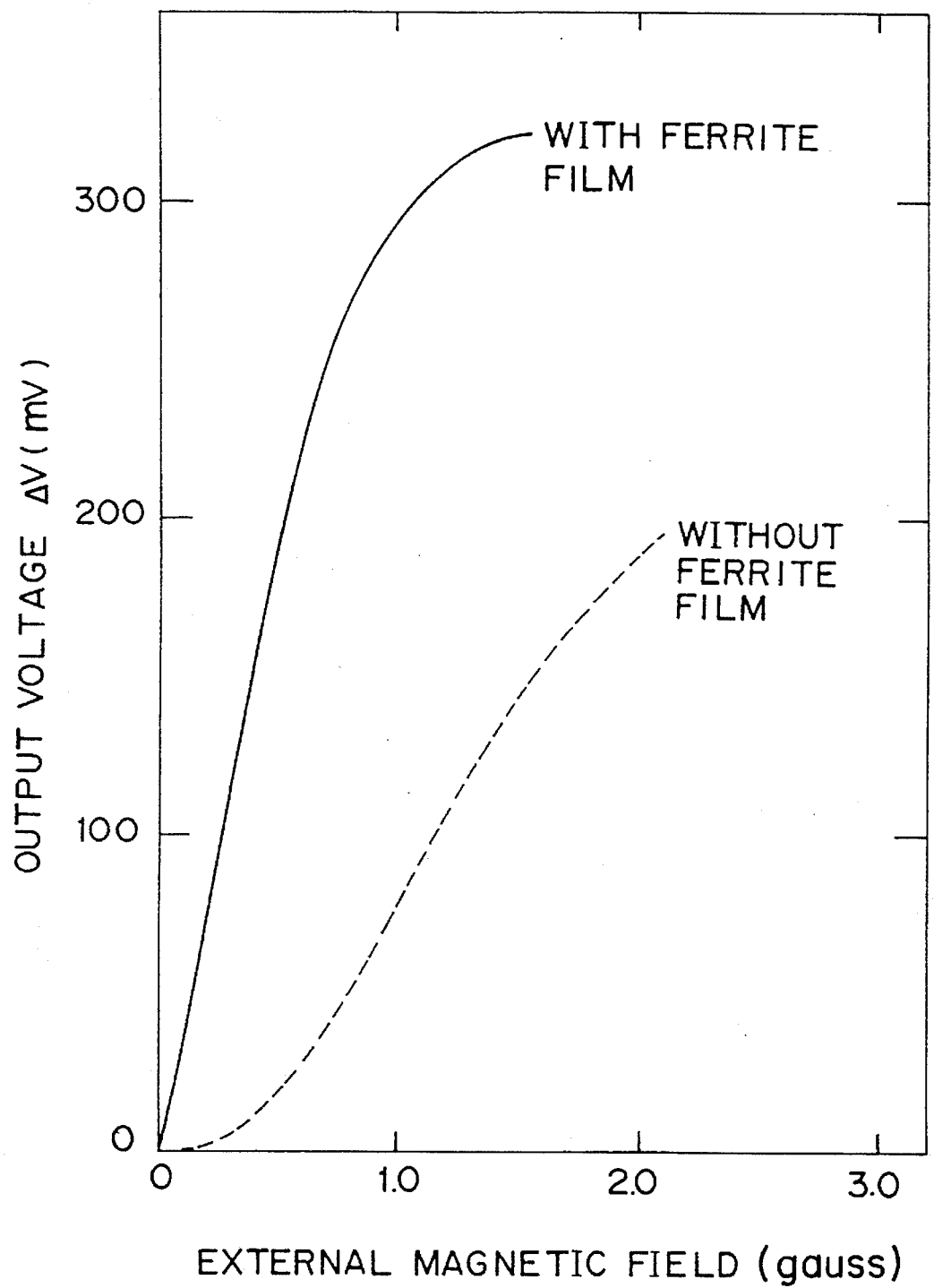
FIG. 12 is a graph showing galvanomagnetic characteristics of the superconducting magnetic sensor of the sixth embodiment.

As FIG. 12 shows, good improvement is seen in galvanomagnetic sensitivity as a result of the provision of the ferrite film, more particularly in low magnetic fields, say, to the tune of more than ten times as high as the sensitivity of a single element unit. Measurement showed that the magnetic sensitivity of the sensor was $5 \times 10^{-8}$ gauss/(Hz)$^{1/2}$ at a frequency of 100 Hz.

(Seventh Embodiment)

Figure 13:
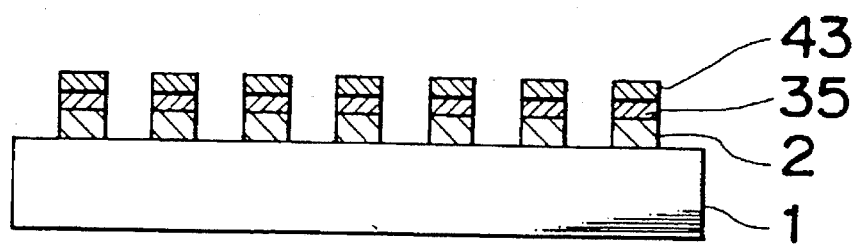
FIG. 13 is an elevational view partly in section showing the construction of a superconducting magnetic sensor representing a seventh embodiment of the present invention.

FIG. 13 shows a superconducting magnetic sensor of a seventh embodiment. This superconducting magnetic sensor comprises a superconductive magnetoresistor (identical with the one already described) 2 formed on one side of a substrate 1, and a film-shaped ferromagnetic element 43 placed thereon through an intermediate layer 35 which serves as a spacer. Therefore, the superconducting magnetic sensor is of a comparatively compact construction.

To fabricate this superconducting magnetic sensor, an Ag-added $Y_1Ba_2Cu_3O_{7-x}$ film is deposited on the substrate 1 by electrodeposition, in same way as in the case of the first embodiment. Then, without heat treatment, a film of silver oxide ($Ag_2O$) is electrodeposited on the first mentioned film, and a film of zinc ferrite is electrodeposited on the second mentioned film. After the Ag-added $Y_1Ba_2Cu_3O_{7-x}$ film 2, $Ag_2O$ film 35, and zinc ferrite film 43 are laid one over another in this way, heat treatment is carried out in air at 900° C. for three hours to sinter the films (the process of fabrication being thus completed).

Figure 15:
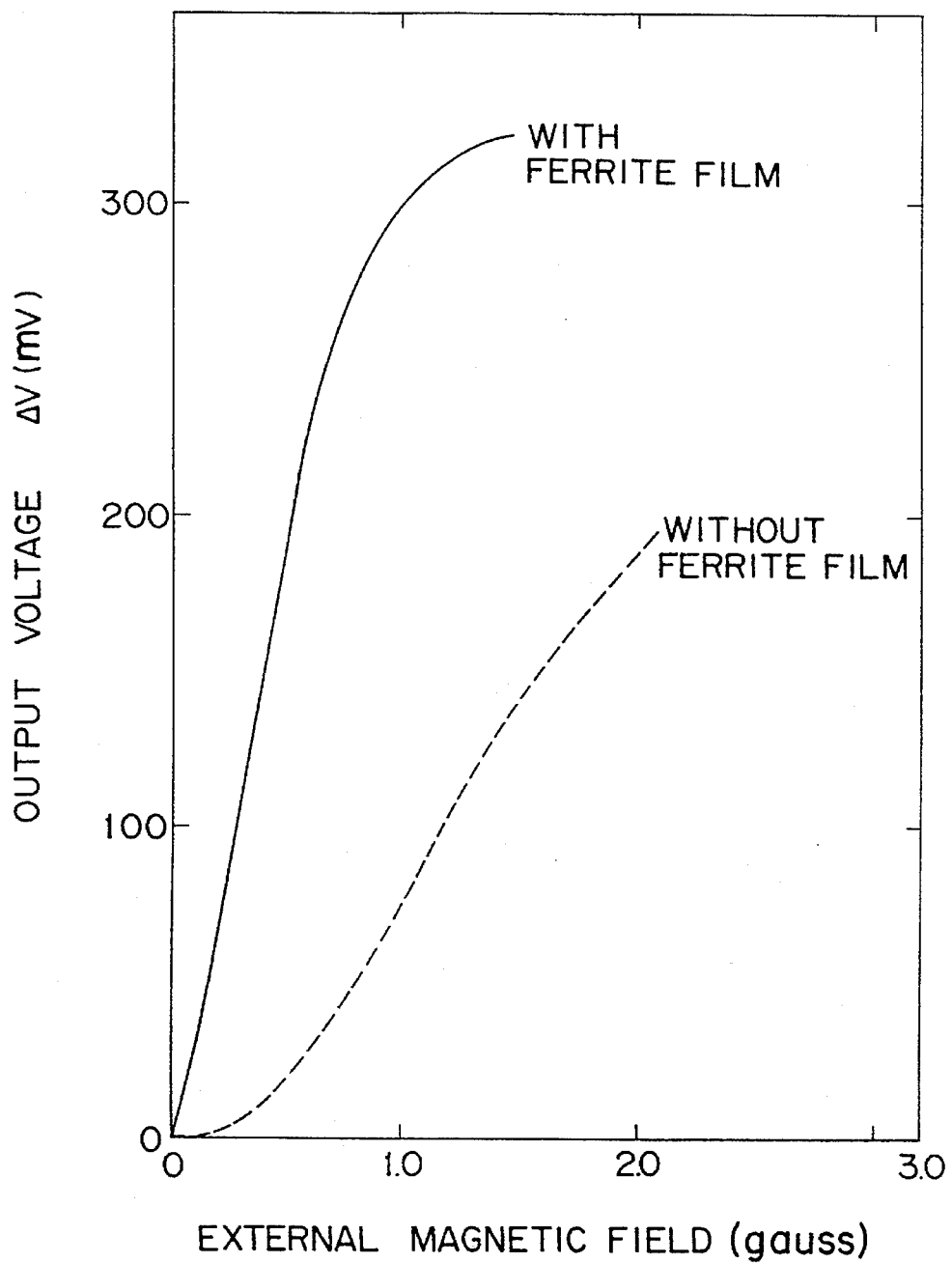
FIG. 15 is a graph showing galvanomagnetic characteristics of the superconducting magnetic sensor of the seventh embodiment.

As FIG. 15 shows, this superconducting magnetic sensor exhibits improved galvanomagnetic sensitivity by virtue of the provision of the ferrite film, and more particularly in low magnetic fields, the sensitivity of the sensor is more than ten times as high as that of a single element unit. Measurement showed that the magnetic sensitivity of the sensor was $5 \times 10^{-8}$ gauss/$(Hz)^{1/2}$.

Figure 14:
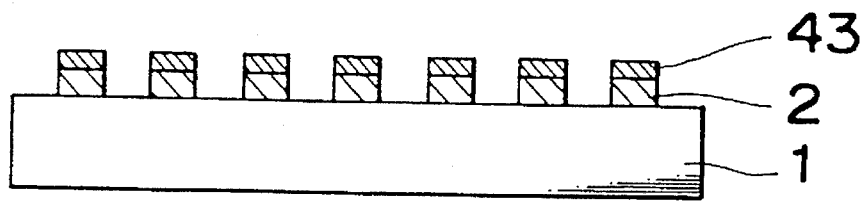
FIG. 14 is an elevational view partly in section showing a modified form of the superconducting magnetic sensor of the seventh embodiment.

FIG. 14 shows, where no intermediate layer 35 was provided and a zinc ferrite film 43 was plated directly on an Ag-added $Y_1Ba_2Cu_3O_{7-x}$ film 2, the resulting sensor did not exhibit any superconducting characteristics at a liquid nitrogen temperature of 77K, failing to act as a magnetic sensor. This is considered to be due to the fact that the $Y_1Ba_2Cu_3O_{7-x}$ film 2 may have chemically reacted with the zinc ferrite film 43 during the stage of heat treatment at 900° C., with the result that the superconducting film 2 was characteristically deteriorated. In the seventh embodiment, the intermediate layer 35 comprised of $Ag_2O$ acts to prevent element diffusion thereby to inhibit possible reaction, there being thus no characteristic deterioration caused. For the above mentioned reason, it is considered that by selecting a ferromagnetic material which is unlikely to react with the $Y_1Ba_2Cu_3O_{7-x}$ film 2 it is possible to omit the intermediate layer.

As described above with reference to the drawings, by using a superconductive magnetoresistor and a ferromagnetic element having high permeability in combination it is possible to effectively converge an external magnetic field into the magnetoresistor and thus to provide considerable improvement in the magnetic sensitivity of magnetic sensors.

The methods of fabrication of superconductive films (superconductive magnetoresistors) and ferromagnetic material films in the foregoing embodiments are not intended to limit the invention but may be suitably varied. In the embodiments, $Y_1Ba_2Cu_3O_{7-x}$ is used as a material for the superconductive magnetoresistor; alternatively, however, other superconductive ceramic materials having a grain boundary, such for example as $Bi_2Sr_2Ca_2Cu_3O_z$, $Bi_2Sr_2Ca_1Cu_2O_z$, $Tl_2Ba_2Ca_2Cu_3O_z$, $(La_{1-x}Ba_x)_2CuO_4$, and $Ba_{1-x}K_xBiO_3$, may be equally used to provide a similar effect. Further, in the foregoing embodiments, permalloy or zinc ferrite is used as a material for the ferromagnetic element. Alternatively, other materials having high permeability, such for example as nickel ferrite and manganese ferrite, may be used to obtain a similar effect. The configuration of the ferromagnetic element is not limited to truncated cone shape, column shape, plate shape, or film shape, but it may be suitably varied to obtain a desired characteristic improvement.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A superconducting magnetic sensor comprising:

a substrate, a continuous superconductive magnetoresistor formed on and in direct contact with the substrate, the continuous superconductive magnetoresistor being comprised of a continuous ceramic superconductive film, and a truncated cone shaped ferromagnetic element for converging an external magnetic field into the superconductive magnetoresistor operatively connected to the superconductive magnetoresistor, the ferromagnetic element having a substantial outer surface area for exposure to the external magnetic field, so that the sensor has a sensitivity level in the order of $10^{-7}$ gauss.

2. A superconducting magnetic sensor comprising:

a substrate, a continuous superconductive magnetoresistor formed on and in direct contact with the substrate, the continuous superconductive magnetoresistor being comprised of a continuous ceramic superconductive film, a ferromagnetic element for converging an external magnetic field into the superconductive magnetoresistor operatively connected to the superconductive magnetoresistor, the ferromagnetic element having a substantial outer surface area for exposure to the external magnetic field, so that the sensor has a sensitivity level in the order of $10^{-7}$ gauss, and a spacer disposed between said continuous superconductive magnetoresistor and said ferromagnetic element providing a gap between and for separating said superconductive magnetoresistor and said ferromagnetic element from each other.

3. A superconducting magnetic sensor as set forth in claim 2, wherein said ferromagnetic element has a truncated cone-shape.

4. A superconducting magnetic sensor comprising:

a substrate, a continuous superconductive magnetoresistor formed on and in direct contact with the substrate, the continuous superconductive magnetoresistor being comprised of a continuous ceramic superconductive film, a ferromagnetic element for converging an external magnetic field into the superconductive magnetoresistor operatively connected to the superconductive magnetoresistor, the ferromagnetic element having a substantial outer surface area for exposure to the external magnetic field, so that the sensor has a sensitivity level in the order of $10^{-7}$ gauss, wherein said ferromagnetic element is located directly on an insulating film on the superconductive magnetoresistor, and there is a second ferromagnetic element having a substantial outer surface area for exposure to the external magnetic field located directly on a surface of the substrate opposite to a surface where the superconductivie element is formed, wherein the ferromagnetic elements are insulated from each other.

5. A superconducting magnetic sensor as set forth in claim 4 wherein both said ferromagnetic elements are in the shape of a truncated cone.

6. A superconducting magnetic sensor as set forth in claim 4 wherein both said ferromagnetic elements are in the shape of flat plates.

\* \* \* \* \*